United States Patent
Huang et al.

(10) Patent No.: US 6,214,739 B1
(45) Date of Patent: Apr. 10, 2001

(54) METHOD OF METAL ETCHING WITH IN-SITU PLASMA CLEANING

(75) Inventors: Cheng-Hao Huang; Wen-Hsiang Tang, both of Taipei; Pei-Hung Chen, Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/244,876

(22) Filed: Feb. 5, 1999

(51) Int. Cl.$^7$ .................................................. H01L 21/302
(52) U.S. Cl. ........................... 438/709; 438/710; 438/720
(58) Field of Search ..................................... 438/710, 720, 438/709

(56) References Cited

U.S. PATENT DOCUMENTS

| | | | |
|---|---|---|---|
| 5,277,750 | * 1/1994 | Frank ..................... | 156/643 |
| 5,378,653 | 1/1995 | Yanagida ............... | 437/194 |
| 5,451,293 | 9/1995 | Tabara .................. | 216/13 |
| 5,540,812 | 7/1996 | Kadomura ............. | 156/652.1 |
| 5,599,742 | 2/1997 | Kadomura ............. | 437/194 |
| 5,647,953 | * 7/1997 | Williams et al. ....... | 156/643.1 |
| 5,756,400 | * 5/1998 | Ye et al. ................ | 438/710 |
| 5,759,916 | 6/1998 | Hsu et al. .............. | 438/636 |
| 5,767,015 | 6/1998 | Tabara .................. | 438/654 |
| 5,851,302 | * 12/1998 | Solis ..................... | 134/1.2 |

* cited by examiner

*Primary Examiner*—Robert Kunemund
*Assistant Examiner*—Vanessa Perez-Ramos
(74) *Attorney, Agent, or Firm*—George O. Saile; Stephen B. Ackerman; William J. Stoffel

(57) ABSTRACT

A method of etching a metal layer on a semiconductor device using an in-situ plasma cleaning step following the metal etch. The process begins by forming a metal layer over a semiconductor substrate. A photoresist mask is formed over the metal layer. The metal layer is patterned by dry etching unmasked areas of the metal layer in a plasma etching chamber. Polymer formations are formed during etching on the metal sidewalls and the walls of the plasma etching chamber. A novel plasma cleaning step is performed in-situ to partially remove the photoresist and to soften and partially remove the polymer formations formed on the metal sidewalls during etching. The plasma cleaning also partially removes polymer from the walls of the plasma etching chamber. The substrate is removed from the plasma etching chamber, and placed in an ashing chamber, and the remaining photoresist is removed. The substrate is removed from the ashing chamber and the remaining polymer formations are removed in a wet etch process.

8 Claims, 2 Drawing Sheets

METHOD OF METAL ETCHING WITH IN-SITU PLASMA CLEANING

BACKGROUND OF INVENTION

1) Field of the Invention

This invention relates generally to fabrication of semiconductor devices and more particularly to a process for etching metal with an in-situ plasma cleaning step.

2) Description of the Prior Art

In semiconductor fabrication, circuit elements or devices are typically connected by patterned metal layers. Metal gates are also increasingly formed from patterned metal layers. The patterned metal layers are typically formed by photolithography and etching. During etching polymers form on the metal sidewalls. The photoresist mask and polymer formations on the metal sidewalls are difficult to remove. When the metal etching source gasses include both $CHF_3$ and $N_2$ polymers form easily on the chamber walls as well as the metal sidewalls. Typically multiple wet etching cycles are required to adequately remove the polymers.

The importance of overcoming the various deficiencies noted above is evidenced by the extensive technological development directed to the subject, as documented by the relevant patent and technical literature. The closest and apparently more relevant technical developments in the patent literature can be gleaned by considering: U.S. patents:

U.S. Pat. No. 5,759,916 (Hsu et al.) discloses a method for forming a void free TiN anti-reflective coating on aluminum containing, conductor layer and patterning using a conventional etching process.

U.S. Pat. No. 5,767,015 (Tabara) discloses a W-plug etch back using $SF_6$ and $N_2$ and switching to a chlorinated gas before exposing the Al alloy layer to prevent $AlF_3$ formation which makes photoresist removal difficult.

U.S. Pat. No. 5,599,742 (Kadomura) discloses a method of coating Al sidewalls with a sulpher nitride to prevent corrosion.

U.S. Pat. No. 5,540,812 (Kadomura) discloses a method of etching an Al layer using a Cl or Br compound followed by an etch using a compound containing S and F to deposit S on Al sidewalls.

U.S. Pat. No. 5,451,293 (Tabara) discloses a method of ashing using $O_2$, an H and O containing gas, and a F containing gas to remove resist after etching.

U.S. Pat. No. 5,378,653 (Yanagida) discloses a method of forming an Al-based pattern using a post-etch processing step using $CF_4$ and $O_2$ to remove a sidewall protection film.

SUMMARY OF THE INVENTION

It is an object of the present invention to provide a method for metal etching that requires fewer cycles of wet stripping to remove sidewall polymer formation.

It is another object of the present invention to reduce the cycle time for the metal etch stage of manufacturing a semiconductor device.

It is another object of the present invention to reduce chemical consumption during the metal etch stage of manufacturing a semiconductor device.

It is yet another object of the present invention to extend the periodic maintenance schedule for the etch chamber by reducing particle contamination.

To accomplish the above objectives, the present invention provides a method of etching a metal layer on a semiconductor device using an in situ plasma cleaning step following the metal etch. The process begins by forming a metal layer over a semiconductor substrate. A photoresist mask is formed over the metal layer using photolithography. The metal layer is dry etched in a plasma etching chamber to form metal structures with sidewalls. The dry etch causes a reaction which forms polymer formations on the sidewalls of the metal structures. In the key step, the the photoresist mask is partially removed and the polymer formations are softened and partially removed in an in-situ plasma cleaning step using $O_2$ and $SF_6$ as source gasses. Polymer formations are also removed from the chamber walls in the in-situ cleaning step. Next, the substrate is removed from the plasma etching chamber and the remaining portion of the photoresist mask is removed. Finally, the remaining portion of the hard polymer formations are removed in a single wet etch cycle.

The present invention provides considerable improvement over the prior art. In conventional metal etching, it is typical to perform two or more cycles of wet stripping. The present invention allows the polymer formations to be removed by a single wet stripping cycle. The elimination of multiple wet strip cycles reduces chemical usage and reduces cycle time. An additional benefit of the present invention is that the in-situ plasma etch removes polymers that have formed on the walls of the etching chamber, thereby extending the periodic maintenance cycle of the etching chamber. Together these benefits provide a more economical process for metal etching.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of etching metal layers on a semiconductor device.

Substrate, as used in the following description means a silicon substrate suitable for use in manufacturing an integrated circuit. The substrate may have already undergone one or more processing steps, including any steps previously described herein.

Figure 1A:
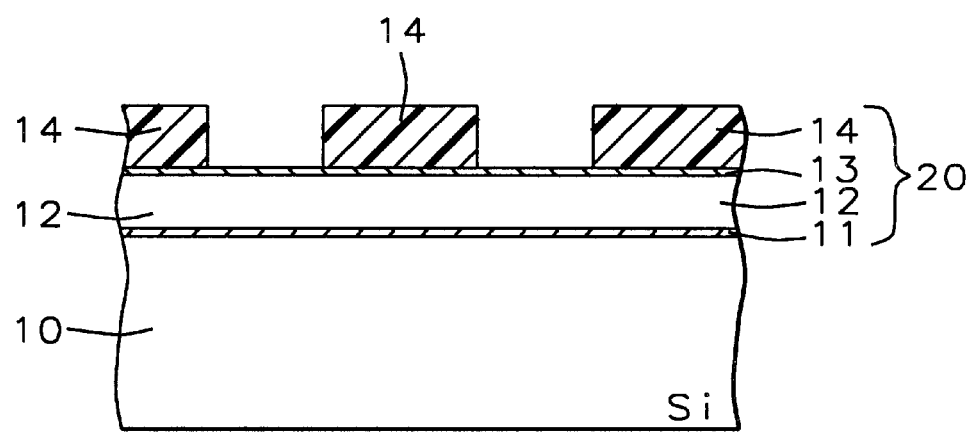
FIGS. 1A, 1B, 1C, 1D & 1E illustrate sequential cross-sectional views of the present invention's process for etching metal.

Referring to FIG. 1A, the process begins by forming a metal layer 20 over a semiconductor substrate 10. The metal layer 20 is preferably composed of aluminum or an aluminum alloy, and most preferably Al—Cu. The metal layer can be a sandwich structure consisting of a TiN laye 11, a Al—Cu layer 12, and a TiN layer 13. The TiN and Al—Cu layers can be formed by any of several methods that are well known in the art.

Still referring to FIG. 1A, a photoresist mask 14 is formed over the metal layer 20 using photolithographic techniques as are well known in the art. The photoresist layer 14 is preferably a DUV photoresist.

FIG. 2, Step 101

Figure 1B:
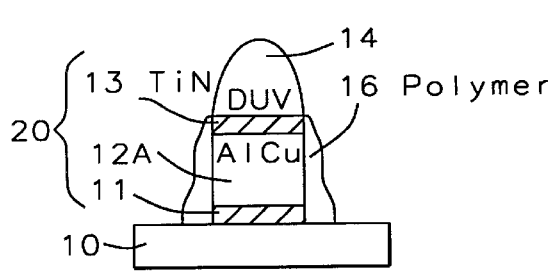

Referring to FIG. 1B, the unmasked portions of the metal layer 20 are dry etched in a plasma etching chamber forming metal structures 20A (e.g. lines, contacts). The dry etch can be performed using $BCl_3$, $Cl_2$ and $N_2$.

During the dry etch a chemical reaction occurs between the metal and the etching chemicals, thereby forming hard polymer formations 16, as shown in FIG. 1B, on the sidewalls of the metal structures 20A as they are etched. The polymer formations 16 contain C, H, B and Cl. They are very hard and adhere strongly to the metal sidewall. Polymer also forms on the walls of the etch chamber. The inventors have found that the photoresist mask 14 undergoes a chemical reaction as well, making it more difficult to remove.

FIG. 2, Step 102

Figure 1C:
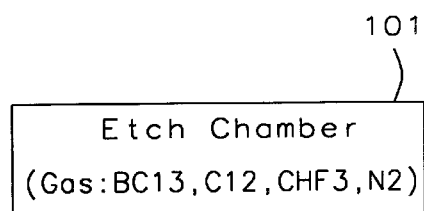
Figure 1C:
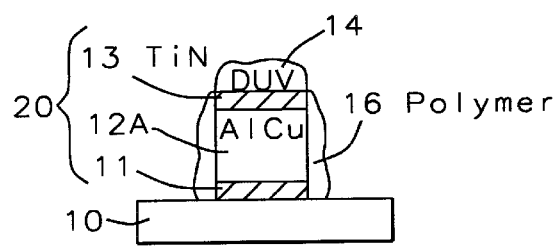

In the key step of the invention, a novel in-situ plasma cleaning step is performed in the plasma etching chamber. The results of the novel plasma cleaning step are illustrated in FIG. 1C. The in situ plasma cleaning is performed in the plasma etching chamber with an $O_2$ flow rate between about 300 sccm and 400 sccm with a target of 350 sccm; an $SF_6$ flow rate between about 20 sccm and 40 sccm with a target of 30 sccm; gas pressure between about 30 mTorr and 50 mTorr with a target of 40 mTorr; microwave power between about 350 W and 450 W with a target of 400 W; and RF bias power between about 25 W and 35 W with a target of 30 W; for a time in the range between about 20 seconds and 30 seconds with a target of 25 seconds. The in situ plasma cleaning step partially removes the photoresist mask 14 and softens and partially removes the polymer formations 16 formed on the sidewalls of the metal structures 20A. Polymers that have formed on the chamber walls are also partially removed. Depending upon the size of the plasma etching chamber, the flow rates can be adusted up or down maintaining a ratio of $O_2$ to $SF_6$ of between 20:1 and 30:4.

FIG. 2, Step 103

Figure 1D:
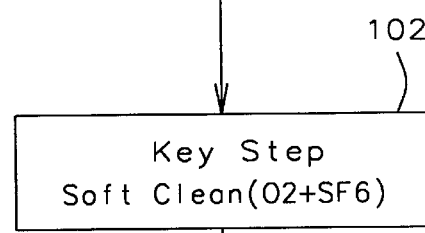
Figure 1D:
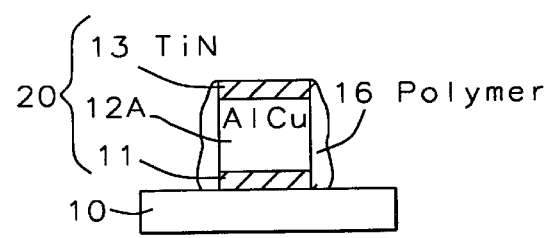

Following the novel plasma cleaning step, the substrate is removed from the plasma etching chamber and placed in an ashing chamber. As shown in FIG. 1D, the remaining photoresist 14 is removed using $O_2$ plasma at a temperature in the range between 225° C. and 275° C.

Alternatively, the remaining photoresist 14 can be removed using a plasma strip. The wafer is placed in the chamber and processed using an °2 plasma and $H_2O$ vapor to prevent corrosion.

FIG. 2, Step 104

Figure 1E:
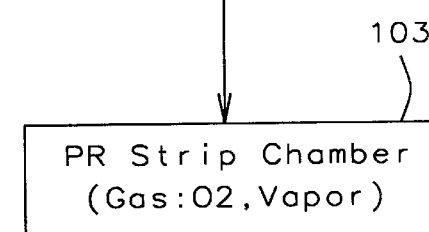
Figure 1E:
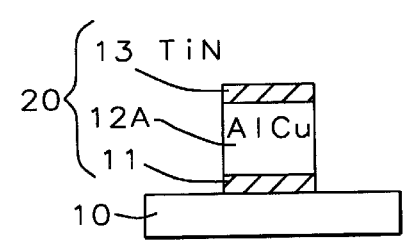
Figure 2:
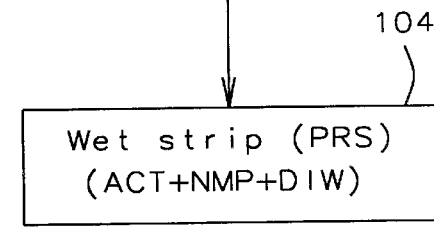
FIG. 2 is a process flow diagram of the process of the present invention.

The substrate 10 is next removed from the ashing chamber and exposed to a wet etch cycle. As shown in FIG. 1E, the remaining polymer formations 16 are removed from the sidewalls of the metal structures 16 using a bench type wet etch process. The wet strip process flow preferably consists of sequential tanks of: a chemical solvent such as ACT; N-methyl-2-pyrolidine; deionized water; and a dryer. The total process time is about 70 minutes.

While the invention has been particularly shown and described with reference to the preferred embodiments thereof, it will be understood by those skilled in the art that various changes in form and details may be made without departing from the spirit and scope of the invention. For example, the etch process may be scaled up or down for different size chambers by maintaining the same molar ratios.

What is claimed is:

1. A method of softening and partially removing hard polymer formations from Al containing metal, following a plasma etch of said Al containing metal, comprising the steps of:

providing a semiconductor substrate having an Al containing metal layer thereon;

etching said Al containing metal using a Cl containing gas and a N containing gas, thereby forming hard polymer formations on said Al containing metal, and softening and partially removing said hard polymer formations by plasma cleaning using $O_2$ and $SF_6$ as source gasses; whereby residual hard polymer formations can be more easily removed from said aluminum containing metal in subsequent process steps.

2. The method of claim 1 wherein said plasma cleaning is performed with a flow rate ratio of $O_2$ to $SF_6$ of between about 7.5 and 20; gas pressure between about 30 mT and 50 mT; microwave power between about 350 W and 450 W; and RF bias power between about 25 W and 35 W; for a time in the range between about 20 seconds and 30 seconds.

3. The method of claim 1 wherein said plasma cleaning is also used to remove hard polymer formations from a plasma etch chamber wall.

4. A method of etching metal layers formed over a semiconductor substrate, comprising the steps of:

a. forming a metal layer, over a semiconductor substrate; sad metal layer comprising aluminum;

b. forming a photoresist mask over said metal layer;

c. dry etching said metal layer in a plasma etching chamber; thereby forming metal structures with sidewalls; whereby polymer formations are formed on said sidewalls, d. in-situ plasma cleaning said semiconductor substrate in said plasma etching chamber using only $O_2$ and $SF_6$ as source gasses to partially remove said photoresist mask and to soften and partially remove said polymer formations are formed on said sidewalls of said metal structures during etching;

e. removing said semiconductor substrate from the plasma etch chamber;

f. removing the remaining photoresist; and g. removing the remaining polymer formations; wherein the remaining polymer formations are removed be a wet etch cycle of about 70 minutes.

5. The method of claim 4 wherein said in-situ plasma cleaning is performed in said plasma etching chamber with a flow rate ratio of O2 to SF6 of between about 7.5 and 20; gas pressure between about 30 mT and 50 mT, microwave power between about 350 W and 450 W; and RF bias power between about 25 W and 35 W; for a time in the range between about 20 seconds and 30 seconds.

6. The method of claim 4 wherein said metal layer comprises a TiN/Al—Cu/TiN sandwich structure.

7. A method of etching metal layers formed over a semiconductor substrate, comprising the steps of:

a. providing a semiconductor substrate having a metal layer comprising aluminum thereover;
b. forming a photoresist mask over said metal layer;
c. dry etching said metal layer in a plasma etching chamber; thereby forming metal structures with sidewalls; whereby polymer formations are formed on said sidewalls;
d. in-situ plasma cleaning said semiconductor substrate in said plasma etching chamber using only $O_2$ and $SF_6$ as source gasses with a flow rate ratio of $O_2$ to $SF_6$ of between about 7.5 and 20; gas pressure between about 30 mT and 50 mT; microwave power between about 350 W and 450 W; and RF bias power between about 25 W and 35 W, for a time in the range between about 20 seconds and 30 seconds; said plasma cleaning process partially removing said photoresist mask and to softening and partially removing said polymer formations formed on said sidewalls of said metal structures;
e. removing said semiconductor substrate from the plasma etch chamber;
f removing the remaining photoresist; and
g. removing the remaining polymer formations, wherein the remaining polymer formations are removed by a wet etch cycle of about 70 minutes.

8. A method of etching metal layers formed over a semiconductor substrate, comprising the steps of,
a. forming a metal layer over a semiconductor substrate; said metal layer comprising aluminum;
b. forming a photoresist mask over said metal layer;
c. dry etching said metal layer in a plasma etching chamber; thereby forming metal structures with sidewalls; whereby polymer formations are formed on said sidewalls;
d. in-situ plasma cleaning said semiconductor substrate in said plasma etching chamber using only $O_2$ and $SF_6$ as source gasses to partially remove said photoresist mask and to soften and partially remove said polymer formations formed on said sidewalls of said metal structures during etching;
e. removing said semiconductor substrate from the plasma etch chamber;
f removing the remaining photoresist; and
g. removing the remaining polymer formations; with a wet strip cycle using sequentially; ACT, N-methyl-2-pyrolidone, and deionized water.

* * * * *